United States Patent
Sakaguchi

(10) Patent No.: US 8,845,379 B2
(45) Date of Patent: Sep. 30, 2014

(54) MANUFACTURING METHOD FOR ORGANIC EL LIGHTING DEVICE

(75) Inventor: Yoshikazu Sakaguchi, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 13/700,635

(22) PCT Filed: Apr. 27, 2011

(86) PCT No.: PCT/JP2011/060204
§ 371 (c)(1),
(2), (4) Date: Nov. 28, 2012

(87) PCT Pub. No.: WO2011/152162
PCT Pub. Date: Aug. 12, 2011

(65) Prior Publication Data
US 2013/0072078 A1    Mar. 21, 2013

(30) Foreign Application Priority Data
Jun. 2, 2010 (JP) .................. 2010-126735

(51) Int. Cl.
*H01J 1/62* (2006.01)
*H01J 63/04* (2006.01)
*H01J 17/49* (2012.01)
*G09G 3/00* (2006.01)
*G09G 3/32* (2006.01)
*H01L 27/32* (2006.01)

(52) U.S. Cl.
CPC .............. *G09G 3/006* (2013.01); *G09G 3/3208* (2013.01); *H01L 2251/5361* (2013.01); *H01L 27/3202* (2013.01)

USPC .......... 445/2; 445/1; 445/24; 445/25; 445/23; 313/483; 313/503; 313/504; 313/505; 313/506

(58) Field of Classification Search
None
See application file for complete search history.

(56) References Cited

U.S. PATENT DOCUMENTS 7,040,943 B2 *   5/2006   Takahashi et al. ................ 445/6
2004/0208988 A1  10/2004  Takahashi et al.

FOREIGN PATENT DOCUMENTS

| JP | 4-014794 | 1/1992 |
|---|---|---|
| JP | 4-051490 | 2/1992 |
| JP | 11-162637 | 6/1999 |
| JP | 2004-146212 | 5/2004 |
| JP | 2004-164943 | 6/2004 |
| JP | 2004-247088 | 9/2004 |
| JP | 2005-116524 | 4/2005 |
| JP | 2005-293875 | 10/2005 |
| JP | 2005-340149 | 12/2005 |
| JP | 2007-141536 | 6/2007 |
| JP | 2007-207703 | 8/2007 |

OTHER PUBLICATIONS

English machine translation of JP 2007-141536 (Shida et al).*
International Search Report, PCT/JP2011/060204, Jun. 21, 2011.

* cited by examiner

*Primary Examiner* — Natalie Walford
(74) *Attorney, Agent, or Firm* — Young & Thompson

(57) ABSTRACT

Anodes of a plurality of organic EL elements are connected together. A forward bias voltage relative to the potential of anodes and a reverse bias voltage are alternately applied to cathodes of the plurality of organic EL elements at a predetermined period. The ratio of the time for which the reverse bias voltage is applied and the time for which the forward bias voltage is applied is increased.

11 Claims, 13 Drawing Sheets

MANUFACTURING METHOD FOR ORGANIC EL LIGHTING DEVICE

TECHNICAL FIELD

The present invention relates to a manufacturing method for a lighting device that uses organic electroluminescence elements.

BACKGROUND ART

In recent years, organic EL (Electro-Luminescence) elements used for lighting devices have gained attention.

When such organic EL elements are used for products in the field of lighting (hereinafter referred to as organic EL lighting devices), a problem in which shortcircuits occur between their anode and cathode arises as a vitally important issue.

Since organic EL lighting devices have a large light emission area to which an electric field is applied, the likelihood of an occurrence of shortcircuits in the devices may become high and thereby the yield and reliability may deteriorate.

The reasons why shortcircuits occur are, for example, a surface gap that is present on a transparent conductive film (ITO) that is a base layer of an organic layer and that is used for an anode and foreign matter such as dust that adheres between the anode and cathode. Since they may damage an organic film on the ITO or decrease the film thickness, the distance between the anode and cathode may decrease. As a result, shortcircuits may occur at portions locally exposed to a high electric field.

A surface gap may occur due to ITO grains, crystalline particles, foreign matter such as dust that adheres to the ITO that is formed, sediment of Ce used for abrading $SiO_2$ that is the base layer of the ITO, or the like.

To prevent shortcircuits from occurring in the devices, before their shipment, they might be aged and repaired.

However, to prevent shortcircuits from occurring, a technique that applies a forward bias voltage between the anode and cathode of each organic EL element, successively turns on the organic EL elements, and then locally breaks down and insulating portions in which shortcircuits occur, by using laser light, may be used.

In the ordinary aging and repairing technique, products need to be powered until shortcircuits have not occurred for a predetermined long period so as to improve their reliability. Equipment and space will be required for all products that are to be aged.

Another repairing technique that applies a forward bias voltage that is equal to or lower than the light emission voltage of an organic EL element (in which no shortcircuit occurs) to each organic EL element, weakly lights portions that are thinner than normal portions, recognizes their images, and repairs them by using laser light is also known.

A further repairing technique that applies a backward bias voltage (DC) to each organic EL element and locally repairs portions that are thinner than normal portions with a reverse current is used. However, in this technique, the applicable voltage is low and thus many portions are susceptible to the occurrence of shortcircuits. As a result, it is necessary to employ one of the foregoing two techniques.

As such a related art reference, a technique that increases a reverse bias voltage applied to each organic EL element and thereby repairs portions in which shortcircuits occur is disclosed (refer to for example Patent Literature 1).

RELATED ART LITERATURE

Patent Literature

Patent Literature 1: JP2004-247088A, Publication

SUMMARY OF THE INVENTION

Problem to be Solved by the Invention

However, according to the technique described in Patent Literature 1, such a suddenly applied voltage may break down such an element.

An object of the present invention is to provide a manufacturing method for an organic EL lighting device.

Means that Solve the Problem

A manufacturing method according to the present invention is a manufacturing method for an organic EL lighting device using a plurality of organic EL elements, including:

an application step that connect anodes of said plurality of organic EL elements together and alternately applies a forward bias voltage relative to the potential of said anodes and a reverse bias voltage to cathodes of said plurality of organic EL elements at a predetermined period; and an increase step that increases the ratio of the time for which said reverse bias voltage is applied and the time for which said forward bias voltage is applied.

Effect of the Invention

As described above, according to the present invention, an element can be prevented such that repairing voltages applied thereto do not break down itself.

BEST MODES THAT CARRY OUT THE INVENTION

Next, with reference to the accompanying drawings, embodiments of the present invention will be described.

Figure 1:
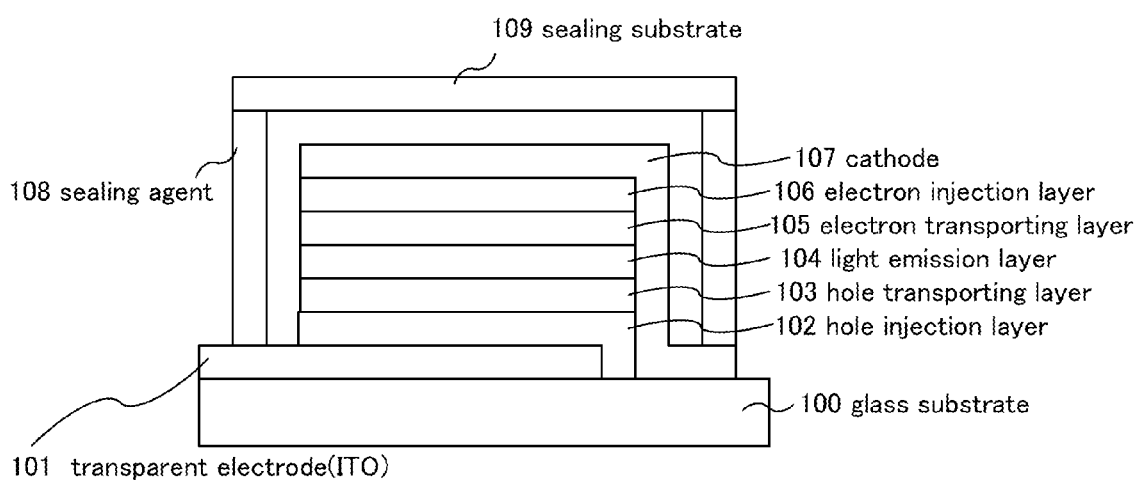
FIG. 1 is a schematic diagram exemplifying the structure of an organic EL element used for an organic EL lighting device.

FIG. 1 is a schematic diagram exemplifying the structure of an organic EL element used for an organic EL lighting device.

The organic EL element shown in FIG. 1 is composed of glass substrate 100; transparent electrode (ITO) 101 that is made of a transparent member and that becomes an anode; hole injection layer 102; hole transporting layer 103; cathode 107; light emission layer 104 that emits light upon application of a predetermined voltage between transparent electrode 101 and cathode 107; electron transporting layer 105; electron injection layer 106; sealing agent 108; and sealing substrate 109.

Organic EL lighting devices are generally provided with a plurality of organic EL elements arranged as shown in FIG. 1.

The present invention is a manufacturing method for an organic EL lighting device that allows portions prone to short-circuits to be automatically repaired while they are being aged in order to prevent the occurrence of the foregoing shortcircuits.

First Embodiment

First, anodes of a plurality of organic EL elements are electrically connected together.

Figure 2:
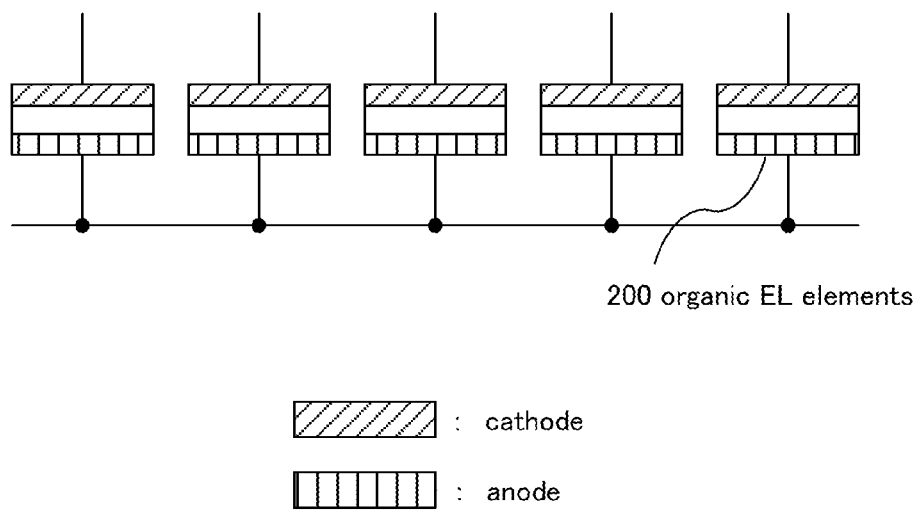
FIG. 2 is a schematic diagram exemplifying the structure in which anodes of a plurality of organic EL elements are connected together.

FIG. 2 is a schematic diagram that exemplifies the structure in which anodes of a plurality of organic EL elements are connected together.

As shown in FIG. 2, organic EL elements 200 each have an anode and a cathode. The anodes of organic EL elements 200 are connected together. At this point, the anodes may lie in a float state or have a predetermined reference potential (for example, they may be grounded or a predetermined voltage may be applied thereto).

A forward bias voltage relative to the potential of the anodes and a reverse bias voltage thereof are alternately applied to the cathodes of organic EL elements 200 at a predetermined period. At this point, it is preferred that the reverse bias voltage be equal to or lower than the breakdown voltage. At this point, moreover, it is preferred that the forward bias voltage be nearly equal to a voltage in the range from a voltage immediately before and after an element emits light to a voltage at which the polarity of the reverse bias voltage is inverted.

Figure 3:
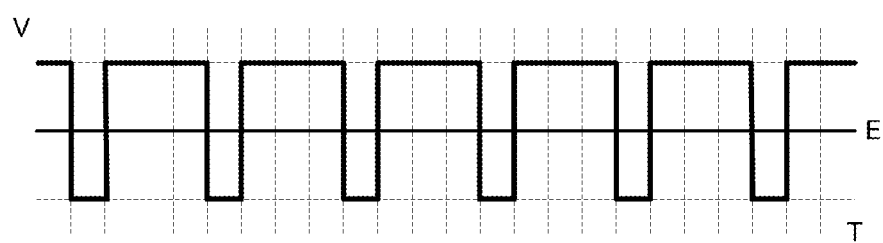
FIG. 3 is a schematic diagram exemplifying a waveform of a voltage applied to cathodes of organic EL elements.

FIG. 3 is a schematic diagram showing an example that represents a waveform of a voltage applied to the cathodes of the organic EL elements.

As shown in FIG. 3, voltage V (forward bias voltage and reverse bias voltage) having a square wave with a predetermined period relative to potential E of the anodes is applied to the cathodes. In the example shown in FIG. 3, the ratio of the time for which the forward bias voltage is applied and the time for which the reverse bias voltage is applied is 3:1.

Figure 4:
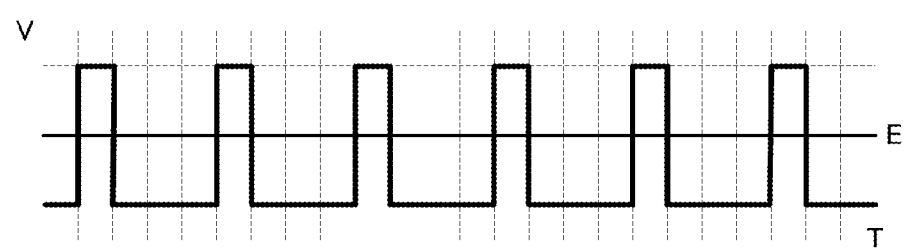
FIG. 4 is a schematic diagram further exemplifying a waveform of a voltage applied to cathodes of organic EL elements.

FIG. 4 is a schematic diagram further exemplifying a waveform of a voltage applied to the cathodes of the organic EL elements.

As shown in FIG. 4, voltage V (forward bias voltage and reverse bias voltage) having a square wave with a predetermined period relative to potential E of the anodes is applied to the cathodes. In the example shown in FIG. 4, the ratio of the time for which the forward bias voltage is applied and the time for which the reverse bias voltage is applied is 1:3.

The ratio of the time for which the reverse bias voltage is applied to the cathodes to the time for which the forward bias voltage is applied to the cathodes with respect to the voltage having the waveform shown in FIG. 4 is greater than that with respect to the voltage having the waveform shown in FIG. 3. In other words, the time for which the reverse bias voltage is applied to the cathodes with respect to the voltage having the waveform shown in FIG. 4 is greater than that with respect to the voltage having the waveform shown in FIG. 3.

Thus, when the ratio of the time for which the reverse bias voltage is applied and the time for which the forward bias voltage is applied is high, the likelihood that the elements can be repaired can be improved.

According to the present invention, the ratio of the time for which the reverse bias voltage is applied and the time for which the forward bias voltage is applied is increased so as to prevent elements, to which such repairing voltages have been applied, do not themselves break down. At this point, the ratio of the time for which the reverse bias voltage is applied and the time for which the forward bias voltage is applied may be increased successively or stepwise.

Next, the present invention will be specifically described.

An organic EL element can be represented by an equivalent circuit in which a diode and a capacitor are connected in parallel. Although an organic EL element has the structure of a capacitor in which an organic thin film is sandwiched between an anode thin film and a cathode thin film, it is difficult to form thin films having equal thicknesses in the order of nm. The thicknesses of each film is uneven. The lower the film thickness, the lower is the withstand voltage. The film thicknesses vary, and so do the withstand voltages.

When a bias (voltage) is applied to the cathodes, portions that are thinner and that have lower withstand voltages relative to the other are successively repaired. It is effective, in cases where organic EL elements that have a large area and many portions that are prone to the occurrence of shortcircuits, to increase the voltage in relation to the thicknesses of the film. It takes a long time to repair portions that have many defects.

When the ratio of the time for which the reverse bias voltage is applied and the time for which the forward bias voltage is applied is increased, elements can be successively repaired such that a sudden bias voltage does not break down the elements.

Figure 5:
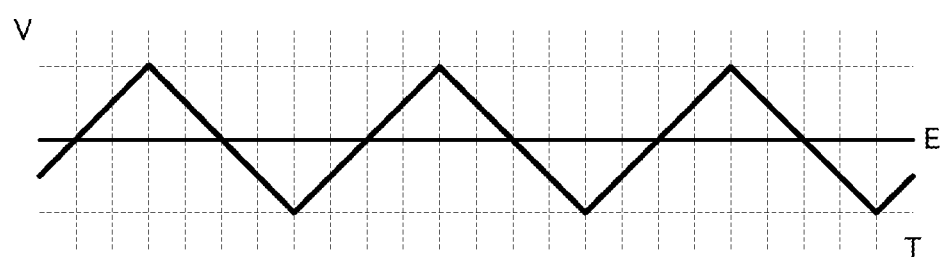
FIG. 5 is a schematic diagram further exemplifying a waveform of a voltage applied to cathodes of organic EL elements.

FIG. 5 is a schematic diagram further exemplifying a waveform of a voltage applied to the cathodes of the organic EL elements.

As shown in FIG. 5, voltage V (forward bias voltage and reverse bias voltage) that has a triangular wave with a predetermined period relative to potential E of the anodes may be applied to the cathodes.

Figure 6:
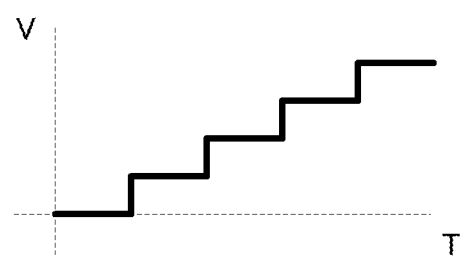
FIG. 6 is a schematic diagram further exemplifying a waveform of a voltage applied to cathodes of organic EL elements.

FIG. 6 is a schematic diagram further exemplifying a waveform of a voltage applied to the cathodes of the organic EL elements.

As shown in FIG. 6, voltage V that has a step-shaped waveform may be applied to the cathodes.

Figure 7:
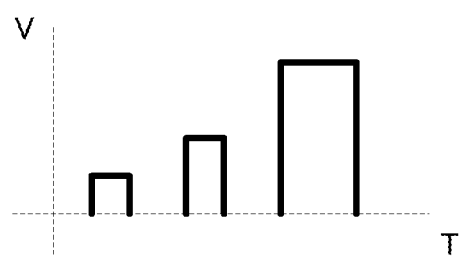
FIG. 7 is a schematic diagram further exemplifying a waveform of a voltage applied to cathodes of organic EL elements.

FIG. 7 is a schematic diagram further exemplifying a waveform of a voltage applied to the cathodes of the organic EL elements.

As shown in FIG. 7, voltage V that has a pulse wave with a predetermined time width may be applied to the cathodes.

Second Embodiment

Alternatively, a forward bias voltage may be applied to cathodes of half of a plurality of organic EL elements and a reverse bias voltage may be applied to cathodes of the other half of the organic EL elements.

Figure 8:
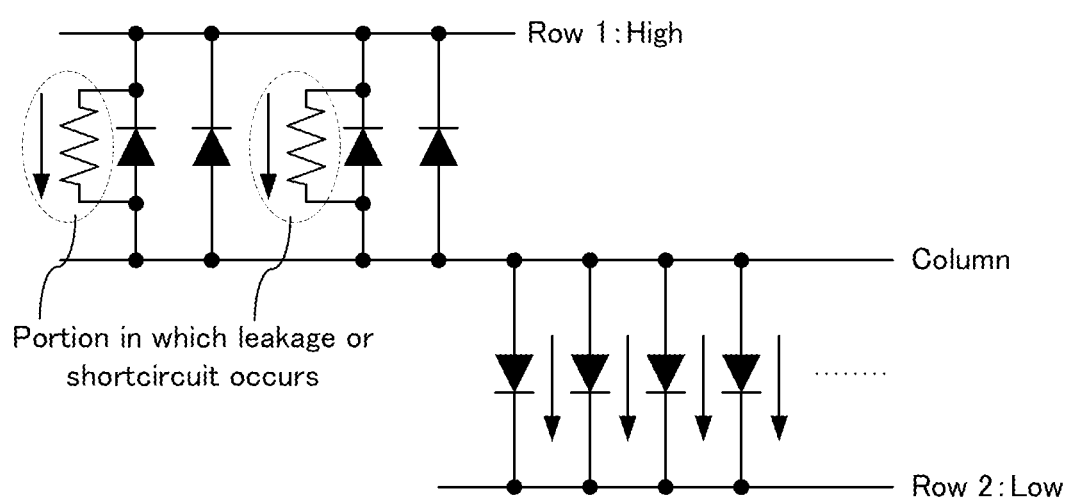
FIG. 8 is a schematic diagram exemplifying connections that cause a forward bias voltage to be applied to cathodes of a half of a plurality of organic EL elements and a reverse bias voltage to be applied to cathodes of the other half of the organic EL elements.

FIG. 8 is a schematic diagram exemplifying connections that cause a forward bias voltage to be applied to cathodes of half of a plurality of organic EL elements and a reverse bias voltage to be applied to cathodes of the other half of the organic EL elements.

FIG. 8 symbolizes diodes of eight organic EL elements. Anodes of the organic EL elements are connected together to a common wire (Column). Cathodes of half (four organic EL elements) of the eight organic EL elements are connected to Row 1, whereas cathodes of the other half (four organic EL elements) of the eight organic EL elements are connected to Row 2. A voltage having a High level relative to the potential of Column is applied to Row 1, whereas a voltage having a Low level relative to the potential of Column is applied to Row 2.

Thus, a forward bias voltage is applied to the organic EL elements connected to Row 2 and thereby a current flows in the arrow direction shown in FIG. 8.

On the other hand, a reverse bias voltage is applied to the organic EL elements connected to Row 1. A current intensively flows to portions prone to leakage or shortcircuits (they are symbolized by resistors) and thereby they are repaired.

Thereafter, the voltages applied to Row 1 and Row 2 are inverted. In other words, a voltage having a Low level relative to the potential of Column is applied to Row 1, whereas a voltage having a High level relative to the potential of Column is applied to Row 2.

As a result, organic EL elements that have not been repaired are repaired. This technique allows many organic EL elements to be simultaneously repaired.

Even if a forward bias voltage is applied, when the voltage is low, since current flows forwardly to elements that are thin relative to other elements, these elements are consequently repaired. The result is that there is an improvement in the likelihood that elements will be repaired.

As in the first embodiment, the reverse bias voltage can be adjusted by increasing the ratio of the time for which the reverse bias voltage is applied and the time for which the forward bias voltage is applied so as to improve the likelihood of repairing the elements.

Third Embodiment

Alternatively, cathodes on each row (column) of a plurality of organic EL elements arranged in a matrix shape may be connected together and a forward bias voltage and a reverse bias voltage may be alternately applied to the adjacent rows (columns).

For example, cathodes on each row of a plurality of organic EL elements arranged in a matrix shape may be connected together and a forward bias voltage and a reverse bias voltage may be alternately applied to the electrodes on the adjacent rows.

Figure 9:
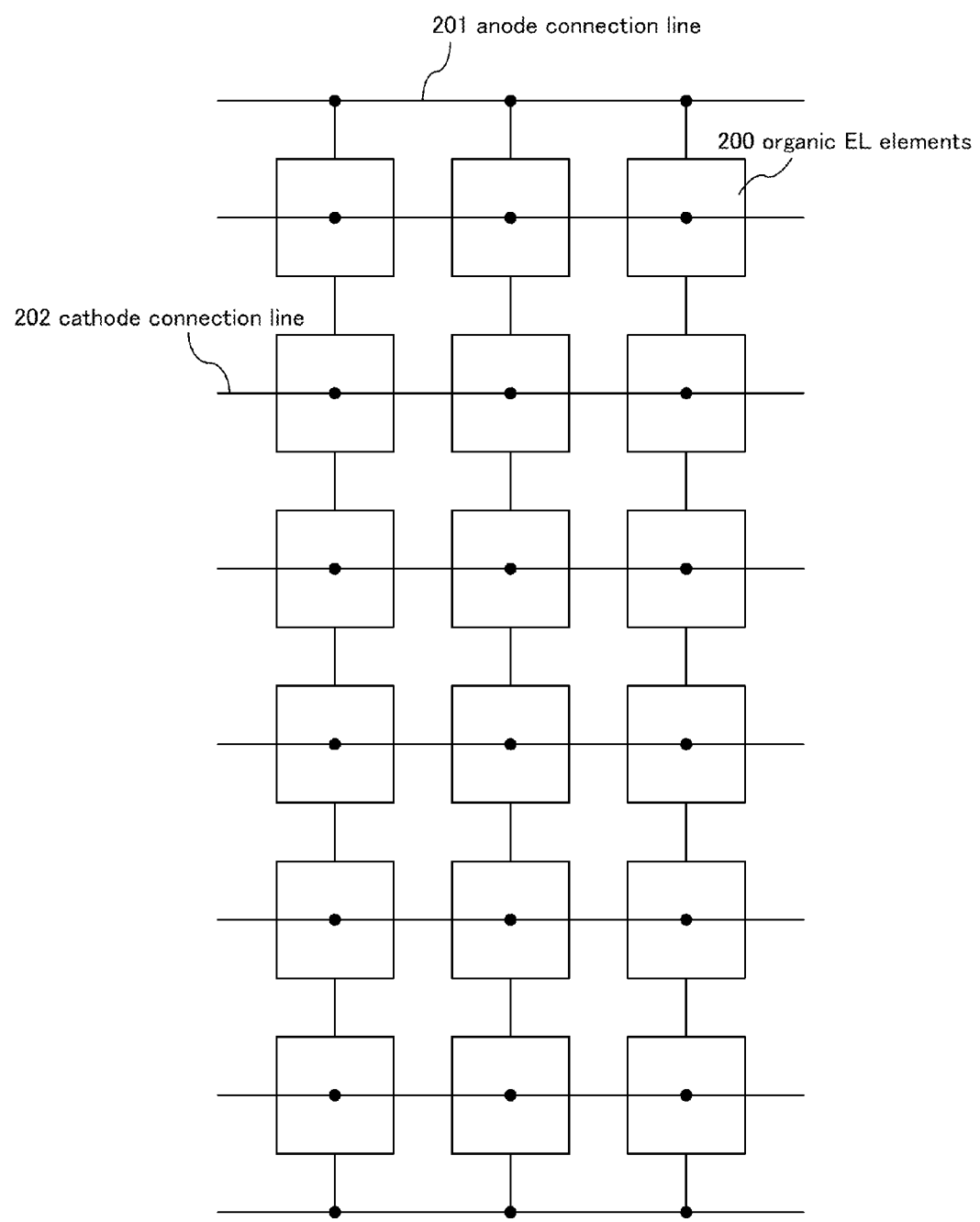
FIG. 9 is a schematic diagram viewed from a cathode side of the structure of an organic EL lighting device in which cathodes on each row of a plurality of organic EL elements arranged in a matrix shape are connected together and anodes of the organic EL elements are connected together.

FIG. 9 is a schematic diagram viewed from the cathode side of the structure of an organic EL lighting device in which cathodes on each row of a plurality of organic EL element arranged in a matrix shape are connected together and anodes of the organic EL elements are connected together.

Figure 10:
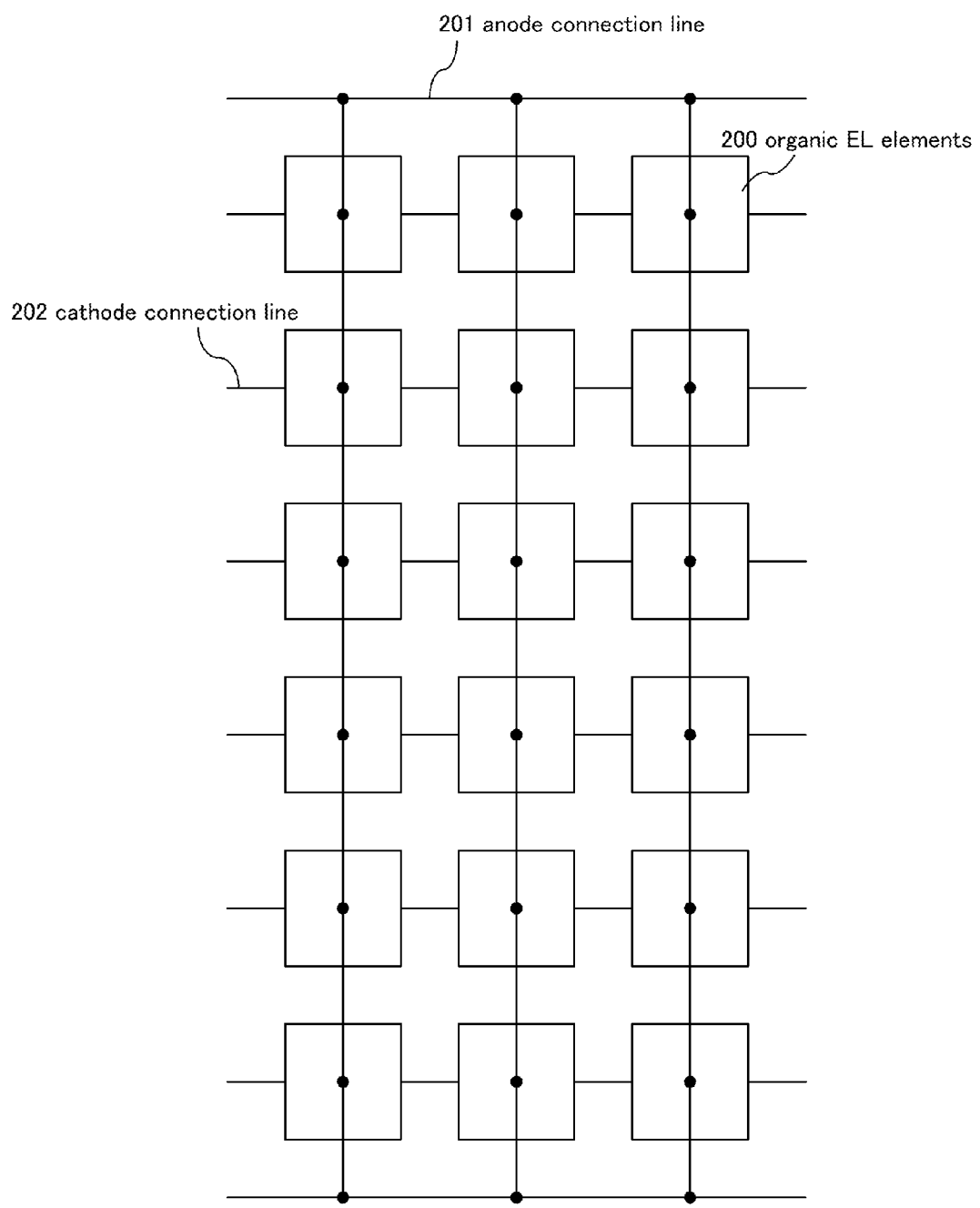
FIG. 10 is a schematic diagram viewed from an anode side of the structure of an organic EL lighting device in which cathodes on each row of a plurality of organic EL elements arranged in a matrix shape are connected together and anodes of the organic EL elements are connected together.

FIG. 10 is a schematic diagram viewed from the anode side of the structure of an organic EL lighting device in which cathodes on each row of a plurality of organic EL element arranged in a matrix shape are connected together and anodes of the organic EL elements are connected together.

As shown in FIG. 9, cathodes on each row of organic EL elements 200 arranged in a matrix shape are connected together to corresponding cathode connection line 202.

In addition, as shown in FIG. 10, anodes of organic EL elements 200 arranged in the matrix shape are connected together to anode connection line 201.

Figure 11:
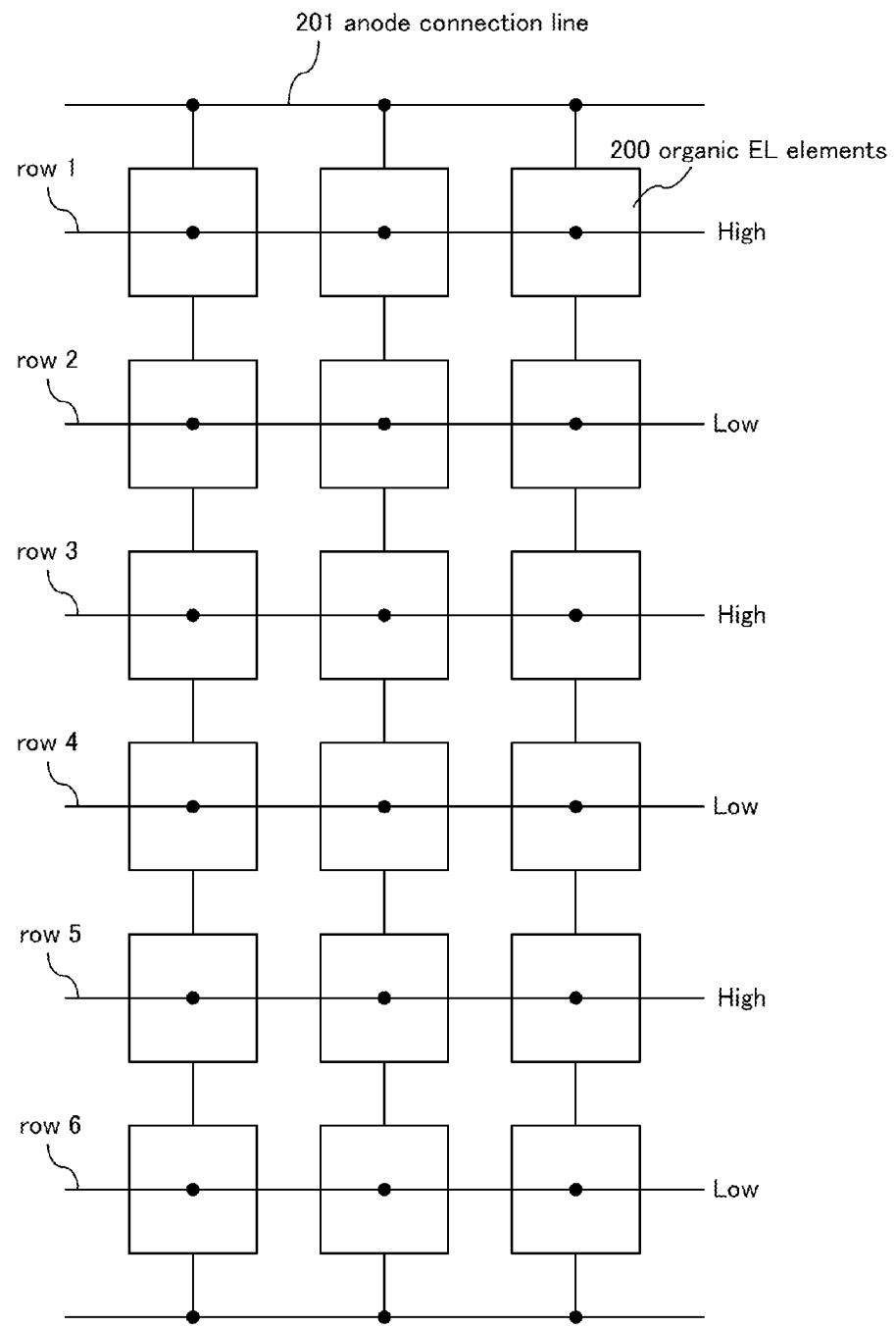
FIG. 11 is a schematic diagram showing that a forward bias voltage and a reverse bias voltage are applied to the anodes of the organic EL elements connected as shown in FIG. 9.

FIG. 11 is a schematic diagram showing that a forward bias voltage and a reverse bias voltage are applied to the cathodes of the organic EL elements connected as shown in FIG. 9.

As shown in FIG. 11, a forward bias voltage having a High level relative to the potential of the anodes is applied to the cathodes on rows 1, 3, and 5 that are odd number rows of the matrix. In addition, a reverse bias voltage having a Low level is applied to the cathodes on rows 2, 4, and 6 that are even number rows of the matrix. Moreover, anode connection line 201 is grounded or placed in a float state. Although FIG. 11 exemplifies the structure in which the matrix has six rows, the present invention does not limit the number of rows of the matrix. Alternatively, according to the present invention, columns may be used instead of rows.

A voltage having a High level and a voltage having a Low level are alternately applied to the cathodes.

Figure 12:
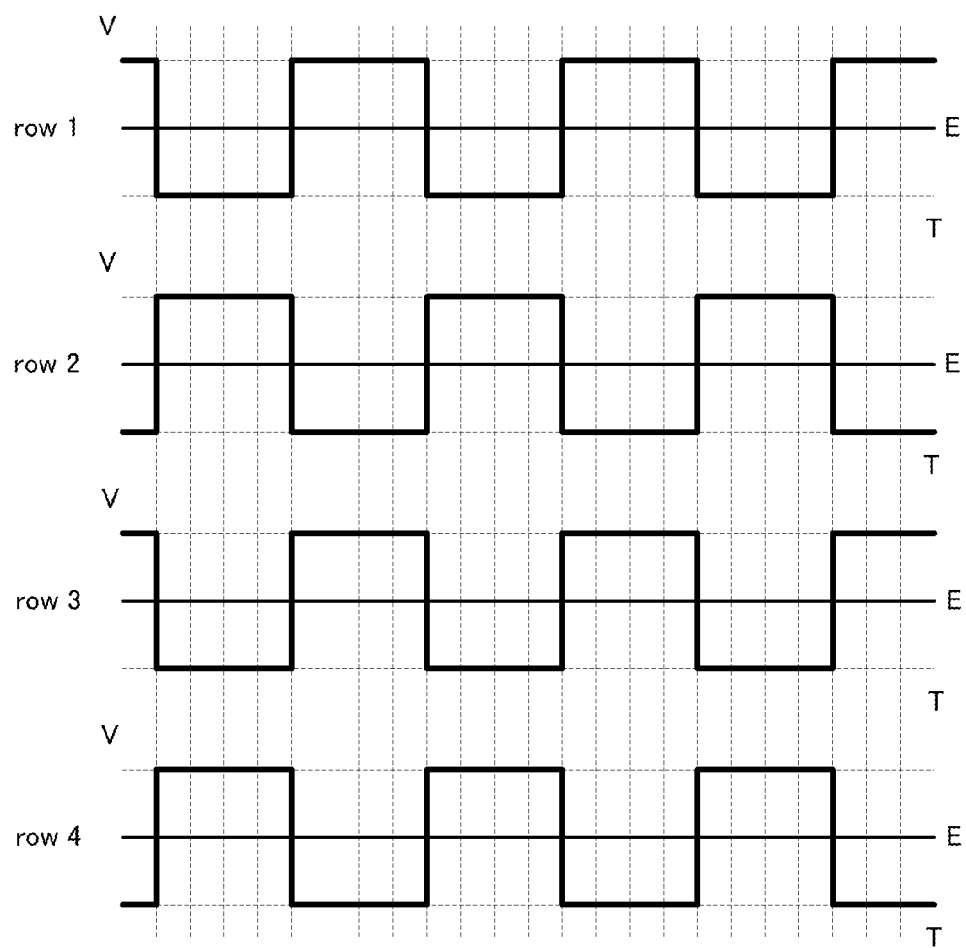
FIG. 12 is a schematic diagram exemplifying waveforms of voltages applied to each row (cathode) in the structure shown in FIG. 11.

FIG. 12 is a schematic diagram exemplifying a waveform of a voltage applied to each row (cathode) of the structure shown in FIG. 11. In FIG. 12, waveforms of voltages applied to rows 5 and 6 shown in FIG. 11 are omitted.

As shown in FIG. 12, the waveform of the voltage applied to each row (cathode) of the structure shown in FIG. 11 is a square wave of which a voltage having a High level and a voltage having a Low level are alternately and periodically applied. The waveform of the voltage applied to row 1 is the same as that applied to row 3, whereas the waveform of the voltage applied to row 2 is the same as that applied to row 4. Thus, voltages (a voltage having a High level and a voltage having a Low level) are alternatively and periodically applied.

As a result, a forward bias voltage is applied to an organic EL element to which a voltage having a Low voltage is applied, whereas a reverse bias voltage is applied to an organic EL element to which a voltage having a High level is applied. As a result, when a voltage having a High level is applied, a current intensively flows reversely from portions prone to leakage or shortcircuits and thus the portions are repaired. In the next step, voltages whose Low level and High level have been inverted are applied such that the portions that have not been repaired are repaired.

If, when the voltage is low, a forward bias voltage is applied, a current will flow forwardly to elements that are thin relative to the other elements, and consequently these elements are repaired. The result is that there is an improvement in the likelihood that elements will be repaired. This technique allows many organic EL elements to be simultaneously repaired.

As in the first embodiment, the reverse bias voltage can be adjusted by increasing the ratio of the time for which the reverse bias voltage is applied and the time for which the forward bias voltage is applied so as to improve the likelihood of repairing the elements.

Figure 13:
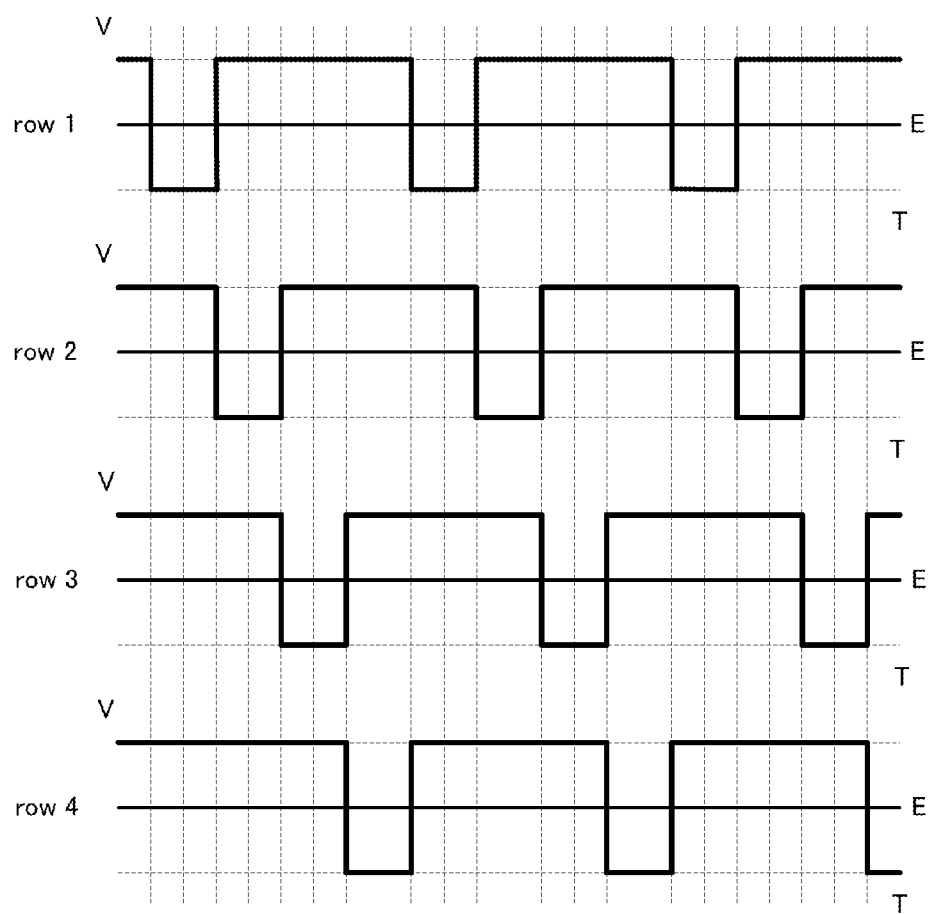
FIG. 13 is a schematic diagram further exemplifying waveforms of voltages applied to each row (cathode) in the structure shown in FIG. 11.

FIG. 13 is a schematic diagram further exemplifying a waveform of a voltage applied to each row (cathode) of the structure shown in FIG. 11. In FIG. 13, waveforms of voltages applied to rows 5 and 6 shown in FIG. 11 are omitted.

As shown in FIG. 13, the waveform of the voltage applied to each row (cathode) of the structure shown in FIG. 11 is a square wave in which a voltage having a High level and a voltage having a Low level are alternately and periodically applied. However, the timing at which the voltage applied to each row is shifted by a predetermined period.

Next, the reason why the cathode side is driven will be described.

The cathode of an organic EL element is generally made of a metal foil of Al or the like. Since the specific resistance of a metal foil is lower than that of the anode side, a current tends to easily flow in the cathode relative to the anode. In addition, since heat can cause a metal foil to evaporate, the melting point of the material is low, localized electric field and concentrated current cause migration and thereby the element can be securely repaired. When connected cathodes are scanned, currents of all anode lines are extracted through one wire. Thus, since a current having a high density instantaneously flows, the likelihood repairing the elements improves.

One of causes that prevent wide use of organic EL illumination is the likelihood that a shortcircuit will occur between an anode and a cathode. According to the present invention, while organic EL elements are being aged, they can be self-repaired unlike the structure of the related art in which they are repaired using laser light after shortcircuits occur therein. In addition, since many organic EL elements can be simultaneously repaired, the manufacturing takt time can be shortened.

A surface lighting device according to the present invention can be applied to an organic EL lighting device, a backlight for a liquid display, and so forth.

With reference to the embodiments, the present invention has been described. However, it should be understood by those skilled in the art that the structure and details of the present invention may be changed in various manners without departing from the scope of the present invention.

The present application claims a priority based on Japanese Patent Application JP 2010-126735 filed on Jun. 2, 2010, the entire contents of which are incorporated herein by reference in its entirety.

The invention claimed is:

1. A manufacturing method for an organic EL lighting device using a plurality of organic EL elements, comprising:
   an application step that connect anodes of said plurality of organic EL elements together and alternately applies a forward bias voltage relative to the potential of said anodes and a reverse bias voltage to cathodes of said plurality of organic EL elements at a predetermined period; and
   an increase step that increases the ratio of the time for which said reverse bias voltage is applied and the time for which said forward bias voltage is applied.

2. The manufacturing method as set forth in claim 1, wherein said increase step is performed by successively increasing said ratio of the time for which said reverse bias voltage is applied and the time for which said forward bias voltage is applied.

3. The manufacturing method as set forth in claim 1, wherein said increase step is performed by increasing said ratio of the time for which said reverse bias voltage is applied and the time for which said forward bias voltage is applied step by step.

4. The manufacturing method as set forth in claim 1, wherein said application step is performed by applying said forward bias voltage to the cathodes of a half of said plurality of organic EL elements and applying said reverse bias voltage to the cathodes of the other half of said plurality of organic EL elements.

5. The manufacturing method as set forth in claim 4, wherein said application step is performed by connecting cathodes on each row of said plurality of organic EL elements arranged in a matrix shape together and applying said forward bias voltage and said reverse bias voltage to the cathodes on the respective adjacent rows.

6. The manufacturing method as set forth in claim 4, wherein said application step is performed by connecting cathodes of each column of said plurality of organic EL elements arranged in a matrix shape together and applying said forward bias voltage and said reverse bias voltage to the cathodes on the respective adjacent columns.

7. The manufacturing method as set forth in claim 1, further comprising:
   another application step that applies a predetermined voltage to the anodes connected together.

8. The manufacturing method as set forth in claim 1, further comprising:
   a grounding step that grounds the anodes connected together.

9. The manufacturing method as set forth in claim 1, wherein said increase step is performed by increasing said reverse bias voltage.

10. The manufacturing method as set forth in claim 1, wherein each organic EL element comprises:
   a glass substrate;
   a transparent indium-tin-oxide electrode that is the anode;
   a hole injection layer;
   a hole transporting layer;
   the cathode;
   a light emission layer that emits light upon application of a predetermined voltage between the transparent electrode and the cathode;
   an electron transporting layer;
   an electron injection layer;
   a sealing agent; and
   a sealing substrate.

11. The manufacturing method as set forth in claim 1, wherein portions prone to short circuits are automatically repaired.

* * * * *